(12) United States Patent
Loughner, II

(10) Patent No.: US 6,734,857 B2
(45) Date of Patent: May 11, 2004

(54) WAVEFORM ZOOM FEATURE WITHIN AN INSTRUMENT HAVING A TABLE DRIVEN GRAPHICAL DISPLAY

(75) Inventor: William Glen Loughner, II, Windsor, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 153 days.

(21) Appl. No.: 10/213,818

(22) Filed: Aug. 7, 2002

(65) Prior Publication Data

US 2004/0027360 A1 Feb. 12, 2004

(51) Int. Cl.[7] ................................................. G09G 5/22
(52) U.S. Cl. ........................ 345/440.1; 345/660; 702/68
(58) Field of Search .............................. 345/440, 440.1, 345/660; 324/76.11, 76.19; 702/66, 67, 68

(56) References Cited

U.S. PATENT DOCUMENTS 5,966,139 A  * 10/1999 Anupam et al. ............ 345/440

OTHER PUBLICATIONS

Agilent 86120B Multi-Wavelength Meter User's Guide, Feb. 2002, p. 2–1 through p. 2–27.*

TI–89/TI–92 Plus User's Guidebook, 1998, p. 231–236. Available at http://education.ti.com/downloads/guidebooks/eng/8992p/14split.pdf.*

Agilent 86120B Multi-Wavelength Meter User's Guide, available as Part No. 86120–90033 from Agilient Technologies Inc., 1400 Fountaingrove Parkway, Santa Rosa, CA 95403–1799, Feb. 2002, pp. 2–1 through 2–27.

* cited by examiner

Primary Examiner—Matthew C. Bella
Assistant Examiner—Aaron M. Richer

(57) ABSTRACT

A display for an instrument includes a graphical display and a tabular display. On the graphical display is shown a plurality of traces. The tabular display lists, for each of at least a portion of the traces, a center point of interest to a user. Upon the user selecting a first center point for a first trace, the graphical display shows just the first trace. A horizontal span of the graphical display is adjusted to equal a preselected zoom span.

20 Claims, 5 Drawing Sheets

WAVEFORM ZOOM FEATURE WITHIN AN INSTRUMENT HAVING A TABLE DRIVEN GRAPHICAL DISPLAY

BACKGROUND

The present invention pertains to display of signals and pertains particularly to a waveform zoom feature within an instrument having a table driven graphical display.

Signal analysis systems, such as optical spectrum analyzers, multi-wavelength meters and oscilloscopes, generally allow display of one or more waveforms, each waveform representing a signal or signal portion. Some signal analysis systems allow both a tabular display and a graphical display of multiple waveforms.

It is often desirable to zoom in on particularly areas of interest in a single waveform within a graphical display of multiple waveforms. For example, within a spectral analysis system, to graphically view the center wavelength of a particular waveform of interest, a user first manually enters the center wavelength. The center wavelength can be obtained, for example, from a value listed in a tabular display. The user can then manually adjust the graph wavelength span until the desired view is achieved.

Alternatively, to graphically view the center wavelength of a particular waveform of interest, a marker search function can be used to position a marker on the signal of interest. If available, the user can then utilize a "Marker->Center" function. After the "Marker->Center" function is used, the user can manually adjust the graph wavelength span until the desired view is achieved.

The above-described methods to graphically view the center wavelength of a particular waveform of interest both require the user to perform several manual adjustments in order to achieve the desired graphical view of the desired waveform. In order to restore the original multi-waveform view, the user then has to perform several more manual adjustments.

The situation is the same for other types of instruments that provide both a graphical view of a raw measurement trace along with some number of numerical parameters derived from the raw measurement trace. If the user is interested in zooming in on just the portion of the trace used to calculate a particular numerical parameter, the graphical limits must be adjusted manually.

SUMMARY OF THE INVENTION

In accordance with the preferred embodiment of the present invention, a display for an instrument includes a graphical display and a tabular display. On the graphical display is shown a plurality of traces. The tabular display lists, for each of at least a portion of the traces, a center point of interest to a user. Upon the user selecting a first center point for a first trace, the graphical display shows just the first trace. A horizontal span of the graphical display is adjusted to equal a preselected zoom span.

DESCRIPTION OF THE PREFERRED EMBODIMENT

Figure 1:
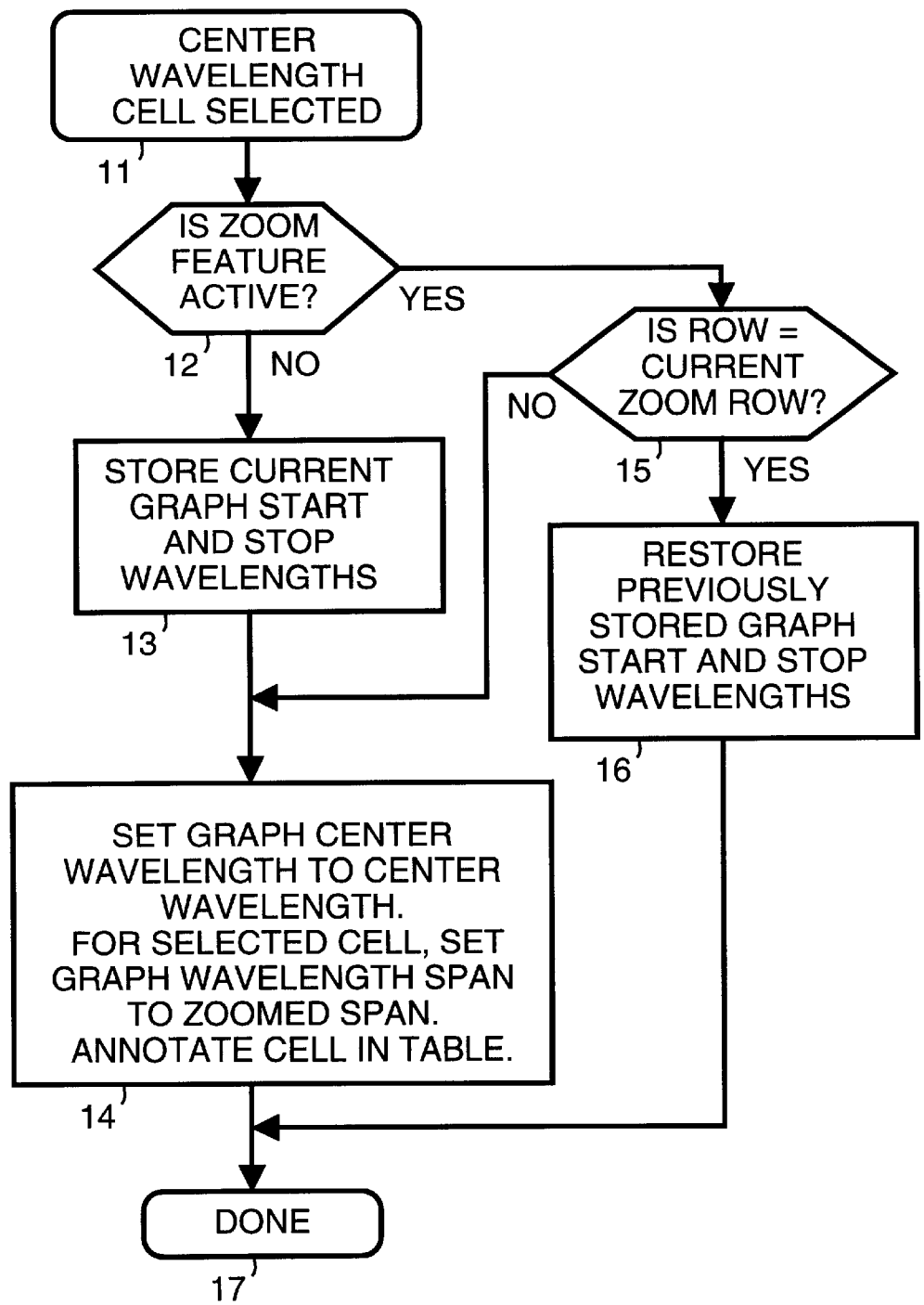
FIG. 1 is a flowchart that describes operation of a waveform zoom feature within an instrument having a table driven graphical display in accordance with a preferred embodiment of the present invention.

FIG. 1 is a flowchart that describes operation of a waveform zoom feature within an instrument having a table driven graphical display. The instrument is, for example, an optical spectrum analysis instrument, such as a multi-wavelength meter (MWM) or optical spectrum analyzer (OSA) used to characterize a signal made up of one or more laser lines. Alternatively, the instrument can be another instrument used for signal analysis, such as an oscilloscope.

A user of a MWM or an OSA is usually interested in several pieces of information. For example, the user typically wants to know what is the center wavelength and peak power of a detected laser line. The user also may want to know what is the qualitative spectral characteristics of individual laser lines.

In the preferred embodiment, a tabular display is used to list all of the detected peaks by their center wavelength and peak power level. A graphical display is used to display the function of power versus wavelength for the measurable spectrum. By adjusting start wavelength and stop wavelength or center wavelength and wavelength span, a user can manually "zoom" the graphical display to get a more detailed view of a selected laser line.

The preferred embodiment of the present invention, allows the user to automatically zoom the graphical display to any waveform of interest by simply selecting a center wavelength cell for the waveform in the tabular display.

Figure 2:
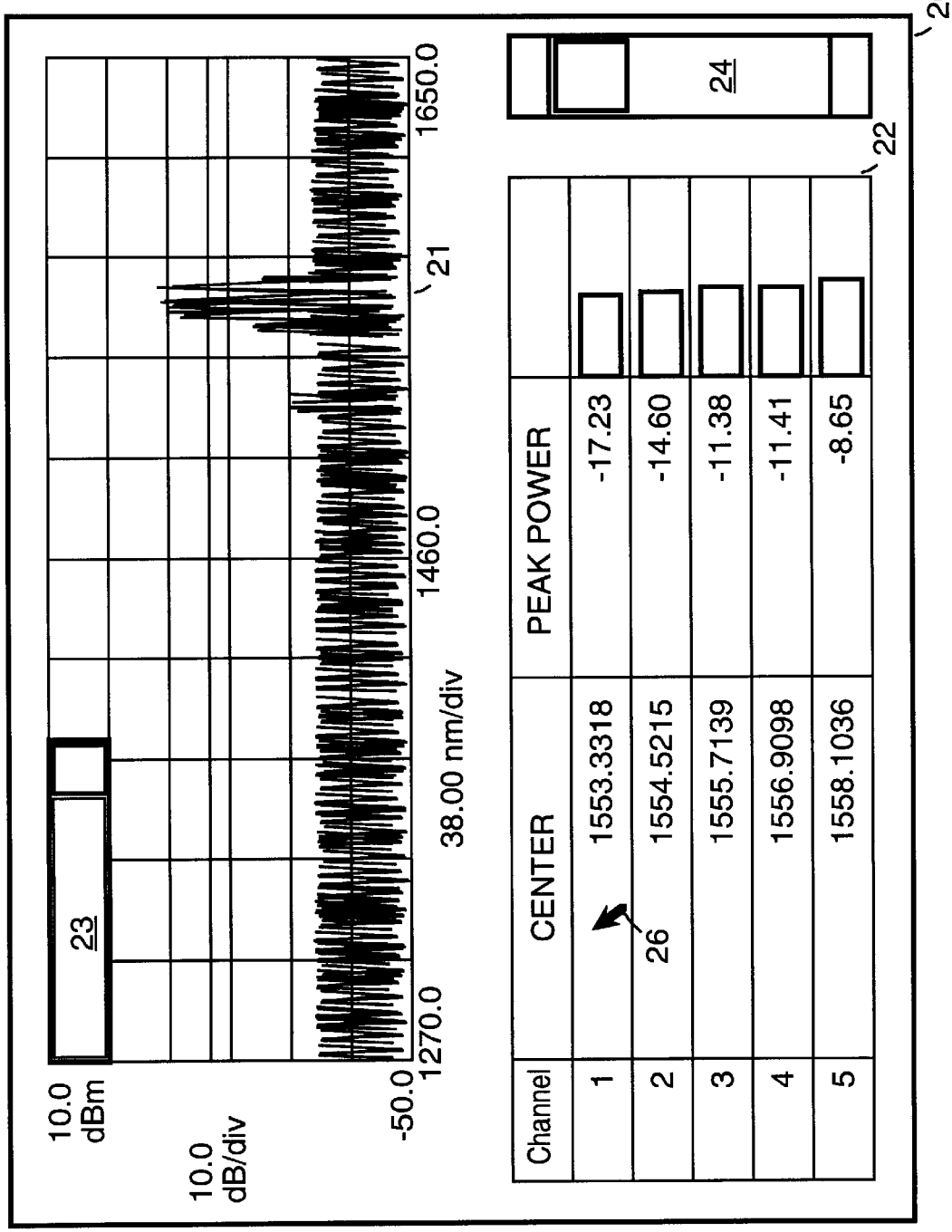
FIG. 2 shows a display of multiple traces within a table driven graphical display.

In block 11 of the flowchart shown in FIG. 1, a center wavelength is selected. This is illustrated by FIG. 2. FIG. 2 shows a display 20 of an instrument. The display includes a graphic display 21 and a tabular display 22. Multiple traces are shown within graphic display 21. Each trace is a waveform representing, for example, a laser line within an optical transmission system. A scroll bar 23 can be used to scroll tabular display 21.

Within tabular display 22, a first column indicates a channel number for a single trace (waveform). A second column indicates a center wavelength for the waveform. A third column indicates peak power for the waveform. A forth column includes a bar that graphically represents power. A scroll bar 24 is used to scroll tabular display 22.

A cursor 26 is controlled by a pointing device, such as a mouse or touchpad, to select one of the center wavelengths listed in the second column. For example a center wavelength is selected by a user placing cursor 26 over one of the center wavelengths listed in the second column of tabular display 22 and "clicking" a button on the pointing device. In FIG. 2, cursor 26 is shown selecting the center wavelength for the channel 1 wavelength.

In a block 12 of the flowchart shown in FIG. 1, a check is made to ascertain whether the zoom feature is active. Within the example shown in FIG. 2, the zoom feature was not active. When the zoom feature is not active, in a block 13, the current graph start and stop wavelengths are stored. This stores the current state of graphic display 21. Then, in a block 14 of the flowchart shown in FIG. 1, the selected waveform is displayed. The center wavelength for graphic display 21 is set to the center wavelength for the selected waveform. The wavelength span for graphic display 21 is set equal to a preselected zoom span. The selected cell in tabular display 22 is also highlighted.

Figure 3:
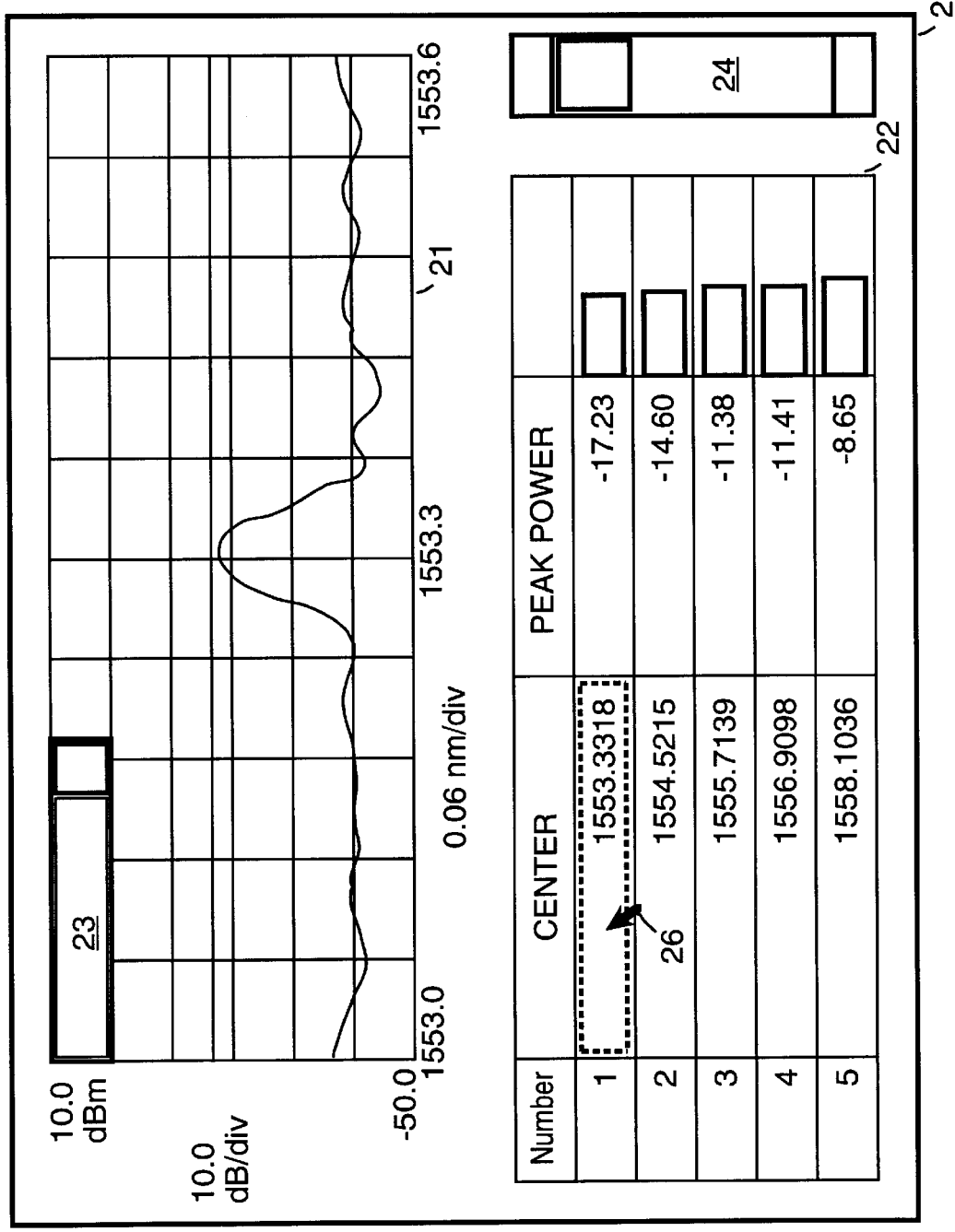
FIG. 3 illustrates a waveform zoom feature within an instrument having a table driven graphical display in accordance with a preferred embodiment of the present invention.

This is illustrated by FIG. 3. In FIG. 3, the waveform for channel 1 is selected. The center wavelength for graphic display 21 is set to 1553.3 nanometers (nm) which is approximately the center wavelength for the waveform for channel 1. The wavelength span for graphic display 21 is set equal to 0.6 nm which is the preselected zoom span. The selected cell in tabular display 22 is also highlighted.

As shown in FIG. 1, after completing the zoom display of the waveform, in a block 17, the zoom display routine is completed.

If in block 12 of the flowchart shown in FIG. 1, the check determines that the zoom feature is active, in a block 15, a check is made to determine whether the row in which the selected center wavelength cell resides is the current zoom row. If not, block 14 is performed for the selected center wavelength cell.

Figure 4:
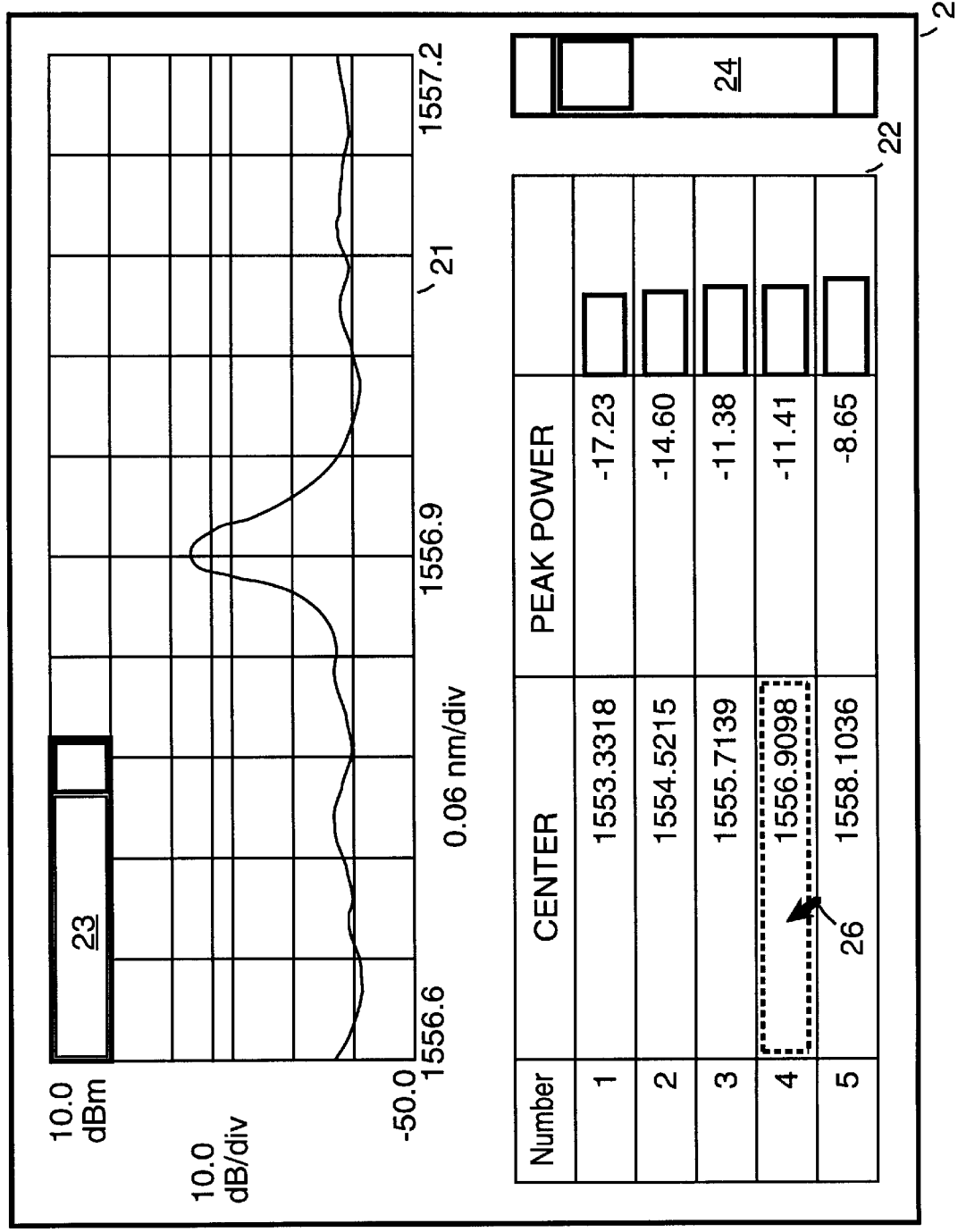
FIG. 4 also illustrates a waveform zoom feature within an instrument having a table driven graphical display in accordance with a preferred embodiment of the present invention.

This is illustrated in the transition from the state of display 20 shown in FIG. 3 to the state of display 20 shown in FIG. 4. From the state of display 20 shown in FIG. 3, the user uses cursor 26 to select the center wavelength for the channel 4 waveform. Since the zoom feature was active and the center wavelength for the channel 4 waveform is represented in a different row that the center wavelength for the channel 1 waveform, block 14 of FIG. 1 has been executed for the channel 4 wavelength.

Specifically, in FIG. 4, the waveform for channel 4 is selected. The center wavelength for graphic display 21 is set to 1556.9 nm, which is approximately the center wavelength for the waveform for channel 4. The wavelength span for graphic display 21 is set equal to 0.6 nm, which is the preselected zoom span. The selected cell in tabular display 22 is also highlighted.

Figure 5:
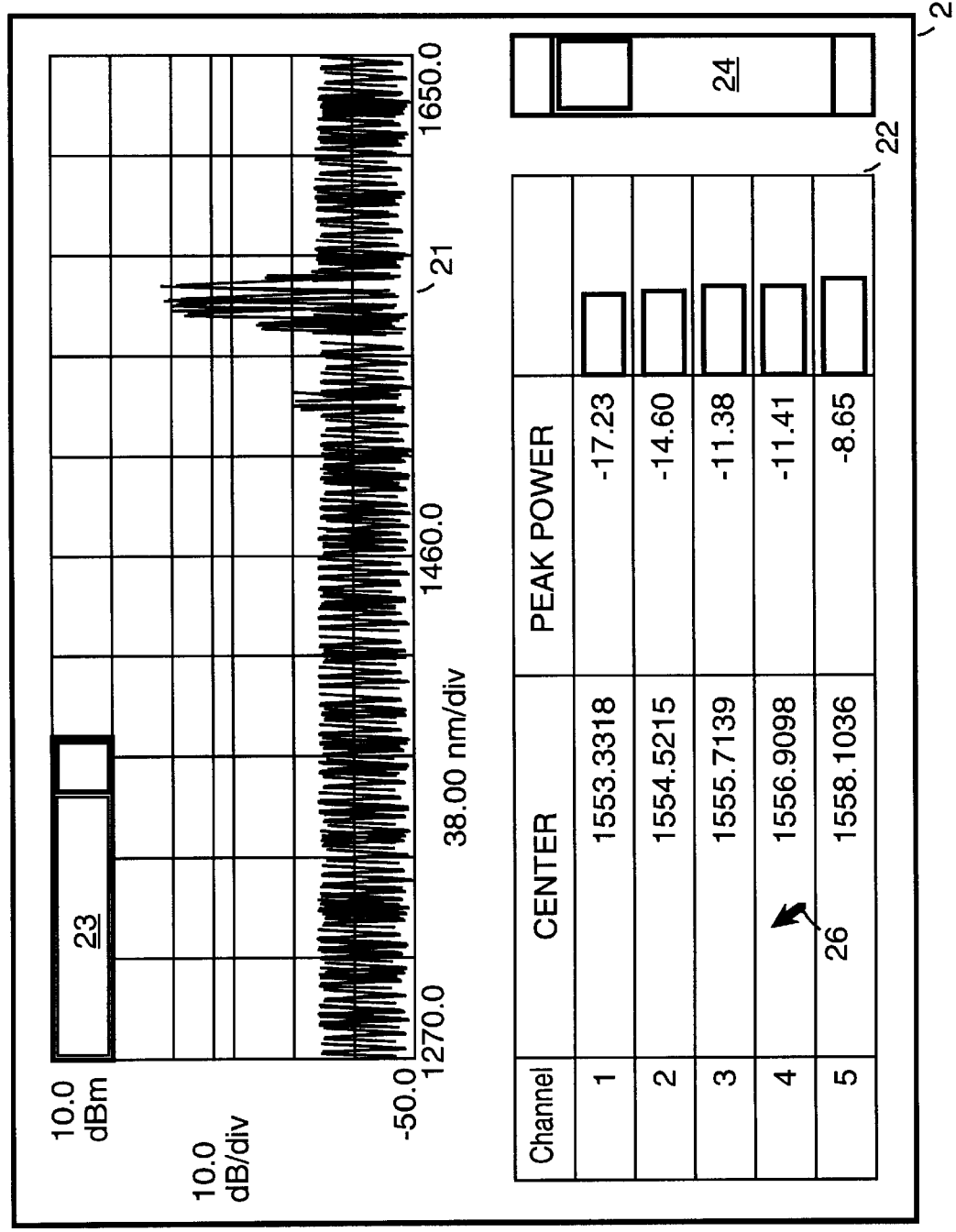
FIG. 5 illustrates return to a display of multiple traces within a table driven graphical display.

If in block 15 of the flowchart shown in FIG. 1, the check determines the row in which the selected center wavelength cell resides is the current zoom row, in a block 16 the previously stored graph start and stop wavelengths are restored. This is illustrated in the transition from the state of display 20 shown in FIG. 4 to the state of display 20 shown in FIG. 5. From the state of display 20 shown in FIG. 4, the user uses cursor 26 to again select the center wavelength for the channel 4 waveform. Since the zoom feature was active and the center wavelength for the channel 4 waveform was reselected, block 16 of FIG. 1 has been executed. This is illustrated in FIG. 5 by the restoration of the start and stop wavelengths resulting in the restoration of the wavelength span and center of graphical display 21. Also, all the waveforms are now displayed in graphical display 21 and no cell in tabular display 22 is highlighted.

As illustrated above, the preferred embodiment of the present invention allows a user to view an entire spectrum, and, with a single action, zoom in to see the detailed spectral characteristics of any and all waveforms of interest. When this detailed viewing of an individual waveform is completed, with another single action the user can return the graphical displays to the previous "pre-zoom" limits, typically a display of the entire measurement spectrum.

The present invention allows for greatly improved ability for the user of an instrument to quickly retrieve both qualitative and quantitative information. The present invention is applicable to any measurement instrument that displays both a graphical representation of the raw measurement data and some number of numerical parameters calculated from features in the raw measurement data. For example, in an alternative embodiment of the present invention, an oscilloscope can display both the raw time-domain trace of an electrical signal along with a measured rise time parameter for a detected rising-edge in the signal. The user may wish to zoom-in on just the portion of the trace used to calculate the rise time parameter. Implementing the present invention in this scenario allows, for example, the oscilloscope to make the rise time display text "active" and the user to click on this text to zoom-in on that portion of the trace.

Embodiments of the present invention allow an unprecedented level of ease-of-use in correlating between quantitative and qualitative information in measurement instruments. Many manual operations can be replaced with a single selection, allowing the user to focus on interpretation of the information presented by the graphical display and not on the instrument-centric operations required to format the graphical data appropriately for viewing.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A display for an instrument comprising:
a graphical display on which is shown a plurality of traces; and,
a tabular display that lists, for each of at least a portion of the traces, a center point of interest to a user;
wherein upon the user selecting a first center point for a first trace, the graphical display shows only the first trace from the plurality of traces with a horizontal span of the graphical display being adjusted to equal a preselected zoom span.

2. A display as in claim 1 wherein each trace in a plurality of traces represents a waveform for a laser line within a laser spectrum.

3. A display as in claim 1 wherein each trace in a plurality of traces represents a waveform for a laser line within a laser spectrum and each center point represents a center wavelength for the laser line.

4. A display as in claim 1 wherein upon the user selecting a second center point for a second trace after selecting the first center point for the first trace, the graphical display shows just the second trace with the horizontal span of the graphical display being adjusted to equal the preselected zoom span.

5. A display as in claim 1 wherein upon the user re-selecting the first center point for the first trace, the graphical display again shows the plurality of traces with the horizontal span of the graphical display being adjusted back to an original span.

6. A display as in claim 1 wherein the instrument is one of the following:
a multi-wavelength meter (MWM);
an optical spectrum analyzer (OSA);
an oscilloscope.

7. A display as in claim 1 wherein each trace in a plurality of traces represents a waveform for a laser line within a laser spectrum, and wherein the tabular display lists with the center point of interest a peak power.

8. A method for providing a zoom feature within a display for an instrument, the method comprising the following steps:

(a) showing a plurality of traces on a graphical display;

(b) showing, on a tabular display, a center point of interest to a user for each of at least a portion of the traces; and, (c) upon the user selecting a first center point for a first trace, performing the following substeps automatically by the display:

(c.1) showing, on the graphical display, only the first trace from the plurality of traces, and (c.2) adjusting a horizontal span of the graphical display to equal a preselected zoom span.

9. A method as in claim 8 wherein each trace in a plurality of traces represents a waveform for a laser line within a laser spectrum.

10. A method as in claim 8 wherein each trace in a plurality of traces represents a waveform for a laser line within a laser spectrum and each center point represents a center wavelength for the laser line.

11. A method as in claim 8 additionally comprising the following step:

(d) upon the user selecting a second center point for a second trace after selecting the first center point for the first trace, performing the following substeps automatically by the display:

(d.1) showing, on the graphical display, just the second trace, and (d.2) adjusting the horizontal span of the graphical display to equal the preselected zoom span.

12. A method as in claim 8 additionally comprising the following step:

(d) upon the user re-selecting the first center point for the first trace, performing the following substeps automatically by the display:

(d.1) showing the plurality of traces on the graphical display, and (d.2) adjusting the horizontal span of the graphical display back to an original span.

13. A method as in claim 8 wherein substep (c.2) includes horizontally centering the first center point on the graphical display.

14. A display for an instrument comprising:

graphical display means for showing a plurality of traces; and, a tabular display means for listing, for each of at least a portion of the traces, a center point of interest to a user;

wherein upon the user selecting a first center point for a first trace, the graphical display means shows only the first trace from the plurality of traces with a horizontal span of the graphical display means being adjusted to equal a preselected zoom span.

15. A display as in claim 14 wherein each trace in a plurality of traces represents a waveform for a laser line within a laser spectrum.

16. A display as in claim 14 wherein each trace in a plurality of traces represents a waveform for a laser line within a laser spectrum and each center point represents a center wavelength for the laser line.

17. A display as in claim 14 wherein upon the user selecting a second center point for a second trace after selecting the first center point for the first trace, the graphical display means shows just the second trace with the horizontal span of the graphical display means being adjusted to equal the preselected zoom span.

18. A display as in claim 14 wherein upon the user re-selecting the first center point for the first trace, the graphical display means again shows the plurality of traces with the horizontal span of the graphical display means being adjusted back to an original span.

19. A display as in claim 14 wherein the instrument is one of the following:

a multi-wavelength meter (MWM);

an optical spectrum analyzer (OSA);

an oscilloscope.

20. A display for an instrument comprising:

a graphical display on which is shown a trace; and, a tabular display that lists, for the trace, a center point of interest to a user;

wherein upon the user selecting the center point for the trace, the graphical display showing the first trace with a horizontal span of the graphical display being adjusted to equal a preselected zoom span and the center point being centered on the graphical display.

* * * * *